(12) United States Patent
Okusawa

(10) Patent No.: US 7,872,853 B2
(45) Date of Patent: Jan. 18, 2011

(54) THIN FILM CAPACITOR, MANUFACTURING METHOD OF THE SAME, AND ELECTRONIC COMPONENT

(75) Inventor: Nobuyuki Okusawa, Tokyo (JP)

(73) Assignee: TDK Corporation, Tokyo (JP)

( * ) Notice: Subject to any disclaimer, the term of this patent is extended or adjusted under 35 U.S.C. 154(b) by 351 days.

(21) Appl. No.: 12/010,622

(22) Filed: Jan. 28, 2008

(65) Prior Publication Data
US 2008/0180880 A1 Jul. 31, 2008

(30) Foreign Application Priority Data
Jan. 31, 2007 (JP) .............................. 2007-022308

(51) Int. Cl.
*H01G 4/06* (2006.01)
*H01G 9/00* (2006.01)
(52) U.S. Cl. .................................... 361/311; 029/25.42
(58) Field of Classification Search ................ 361/311, 361/312–313; 029/25.42
See application file for complete search history.

(56) References Cited

U.S. PATENT DOCUMENTS 5,736,448 A * 4/1998 Saia et al. ................... 438/393

2003/0139016 A1 7/2003 Watanabe et al.

FOREIGN PATENT DOCUMENTS

| JP | A-11-074467 | 3/1999 |
| JP | A-2001-015928 | 1/2001 |
| JP | A-2006-005293 | 1/2006 |
| WO | WO 02/089161 A1 | 11/2002 |
| WO | WO 2007/010681 A1 | 1/2007 |

* cited by examiner

*Primary Examiner*—Eric Thomas
(74) *Attorney, Agent, or Firm*—Oliff & Berridge, PLC

(57) ABSTRACT

There is disclosed a thin film capacitor and the like capable of suppressing fluctuations of a capacity, increasing a $V_{BD}$, and accordingly improving a device. characteristic and reliability of a product. In electronic components 1 to 4, a capacitor 11 is formed on a flat substrate 51 as a base material including a planarization layer 52 formed on the surface thereof. The capacitor 11 has a structure in which a lower conductor 21 constituted of an underlayer conductor 21a and a conductor 21b, a dielectric film 31 made of alumina or the like, a resin layer J1 mainly formed of a novolak resin or the like, a resin layer J2 mainly formed of a polyimide resin or the like, and an upper conductor 25 constituted of an underlayer conductor 25a and a conductor 25b are formed on the planarization layer 52 of the substrate 51. The resin layer J1 has an opening K1 above the lower conductor 21, and the resin layer J2 is provided with an opening K2 opened more widely than the opening K1.

14 Claims, 11 Drawing Sheets

(A)

(B)

THIN FILM CAPACITOR, MANUFACTURING METHOD OF THE SAME, AND ELECTRONIC COMPONENT

BACKGROUND OF THE INVENTION

The present invention relates to a thin film capacitor, a manufacturing method of the thin film capacitor, and an electronic component including the thin film capacitor.

An internal circuit of an electronic apparatus such as a computer or a portable terminal is provided with various surface mounting type electronic components. In recent years, to meet a demand for a higher performance and miniaturization of the electronic apparatus, further thinning of each electronic component (thinning of a film) has been an urgent need. Examples of such a thin film type electronic component include a thin film capacitor, a thin film inductor, a thin film LC composite component, a thin film concentrated constant device, a thin film distribution constant device, and a thin film laminate type composite component. Among them, examples of the composite component having the thin film capacitor include a low pass filter (LPF), a high pass filter (HPF), a band pass filter (BPF) which passes an only signal of a predetermined frequency range and decays a signal of a frequency range other than the predetermined frequency range, and a trap filter which removes the signal of the predetermined frequency range. Additionally, examples of an electronic component in which they are combined include a diplexer, a duplexer, an antenna switch module and an RF module.

Such a thin film capacitor usually has a constitution in which a lower electrode, a dielectric layer and an upper electrode are successively laminated on a base material made of an insulator. With the intentions of easily controlling a capacity and sufficiently securing a breakdown voltage (a dielectric breakdown limit value: hereinafter referred to as "the $V_{BD}$") between the electrodes, a conventional known thin film capacitor is provided with a resin layer (an insulating layer) which has an opening at a position facing the center of the dielectric layer on the electrode and which is disposed so as to cover a peripheral edge of the dielectric layer on the electrode. For example, Japanese Patent Application Laid-Open No. 2006-5293 discloses a thin film capacitor which has such an opening and is equipped with a diffusion preventive layer made of a metal or nitride between a dielectric layer and an upper electrode so as to prevent decrease of a $V_{BD}$ between the electrodes.

However, according to the investigation of the present inventor, it has been found that capacities easily fluctuate between the individual conventional thin film capacitors each provided with the resin layer having the opening. It has also been found that even in the above-mentioned conventional constitution equipped with the diffusion preventive layer, it is difficult to improve a $V_{BD}$ between the electrodes to a sufficiently satisfactory degree.

SUMMARY OF THE INVENTION

The present invention has been developed in view of such a situation, and an object of the present invention is to provide a thin film capacitor capable of suppressing fluctuation of capacities and further increasing a $V_{BD}$ to improve device characteristics and reliability of a product, a manufacturing method of the thin film capacitor, and an electronic component including the thin film capacitor.

To achieve the above object of the present invention, there is provided a thin film capacitor in which a dielectric layer and a resin layer are formed between a first conductor and a second conductor, and the resin layer has a first resin provided between the first conductor and the second conductor and having a first opening in a region where the first conductor or the second conductor and the dielectric layer are superimposed, that is, a region where the capacitor is defined, and a second resin provided between the first conductor and the second conductor and having a second opening which is disposed above the first opening and which is opened more widely than the first opening.

In the thin film capacitor having such a constitution, the resin layer formed between the first conductor and the second conductor (at least a part of one of the conductors functions as a so-called lower electrode, and at least a part of the other conductor functions as an upper electrode) has the first resin (layer) and the second resin (layer), the first opening formed in the first resin is provided in the region where the first conductor or the second conductor and the dielectric layer are superimposed, and the second opening formed in the second resin is provided above the first opening. Then, the second opening is opened more widely than the first opening. That is, an area (a minimum area) of the first opening formed in the first resin is set to be smaller than that of the second opening formed in the second resin, so that a capacitor capacity is appropriately determined (controlled) in accordance with a size of the first opening of the first resin.

Moreover, the resin layer is made of a plurality of resins in this manner. Therefore, a resin having an excellent shape control property as compared with the second resin is used as the first resin, whereby shape uniformity and stability of the first opening are improved to improve shape precision (pattern precision). Moreover, a resin having excellent insulation property and resistance to environment as compared with the first resin is used as the second resin, whereby a $V_{BD}$ between the first conductor and the second conductor is further increased, and a change (deterioration with time) of the $V_{BD}$ with an elapse of time can be suppressed.

Specifically, from a viewpoint of improving the shape uniformity and stability of the first opening, it is preferable that a pattern resolution (a dimensional resolution in patterning) of a material forming the first resin of the resin layer is smaller than that of a material forming the second resin of the resin layer, and it is also preferable that thermal shrinkage of the first resin is smaller than that of the second resin.

On the other hand, from a viewpoint of improving the insulation property and the resistance to the environment of the second resin as compared with the first resin, it is preferable that a resistance value of the second resin of the resin layer is larger than that of the first resin of the resin layer, and it is also preferable that hygroscopicity of the second resin is smaller than that of the first resin.

Moreover, the dielectric layer may be provided so as to be bonded onto the first conductor or the second conductor, but it is more preferable that the dielectric layer is provided between the first resin and the second resin. Such a structure can be obtained by, for example, forming the first resin on the first conductor and then successively laminating the dielectric layer, the second resin and the second conductor on the first resin.

As the first and second conductors, a metal material is usually used, and more specifically, copper (Cu) tends to be used from viewpoints of resistivity, manufacturing cost and the like. As the dielectric layer, any type of oxide having a high permittivity tends to be usually used. Here, a close contact property between the resin material and a metal material such as Cu tends to be higher than that between the resin material and the dielectric layer of oxide or the like, so that from the viewpoint of the shape stability of the first opening which influences the capacitor capacity, it is more preferable to directly cover the first conductor or the second conductor with the first resin than to coating the first conductor or the second conductor with the dielectric layer and forming the first resin on the dielectric layer.

More specifically, in a case where the first resin is formed by photosensitizing and development using a photoresist material as the material of the first resin, when a close contact property between the first resin and an underlayer is insufficient, peel and displacement of the first resin might be easily generated owing to shrinkage during curing and immersion in a developing solution from a deposition interface. Therefore, when the first resin is formed on the first conductor having a higher close contact property with the first resin and the dielectric layer is formed on the first resin, a shape of the first opening is easily stabilized, and the shape precision is further improved.

Furthermore, it is preferable that the resin layer is formed so that a thickness of the second resin is larger than that of the first resin.

In this case, as described above, in a case where the resin having an excellent shape control property as compared with the second resin is used as the first resin and the resin having the excellent insulation property and resistance to the environment as compared with the first resin is used as the second resin, a $V_{BD}$ between the first conductor and the second conductor can further be increased, and a change of the $V_{BD}$ with an elapse of time can further effectively be suppressed.

Furthermore, it is more preferable that the resin layer is formed so that a hem angle of the second resin in the second opening is larger than that of the first resin in the first opening.

In this case, the first resin is planarized more easily than the second resin, and hence the thickness of the second resin having the excellent insulation property can easily be kept to be larger than that of the first resin, so that the $V_{BD}$ between the first conductor and the second conductor can further easily be increased as described above. When a wall surface of the first resin has an acute angle with respect to a bottom surface thereof, and vertically extends, for example, at an angle close to perpendicularity in the first opening where the capacitor is defined, an electric field is easily concentrated on a peripheral edge of a bottom wall, and in this case, dielectric breakdown might be generated at the corresponding portion. On the other hand, in the present invention, the hem angle of the first resin in the first opening is easily reduced, so that the dielectric breakdown owing to such electric field concentration can securely be prevented.

In addition, it is further preferable that the resin layer is provided so that the second resin covers substantially the whole first resin, in other words, so that a forming region of the second resin is larger than that of the first resin and so that a volume of the second resin is larger than that of the first resin.

In such a constitution, as described above, in the case where the resin having the excellent shape control property as compared with the second resin is used as the first resin and the resin having the excellent insulation property and resistance to the environment as compared with the first resin is used as the second resin, a $V_{BD}$ between the first conductor and the second conductor can further be increased, and the change of the $V_{BD}$ with the elapse of time can further effectively be suppressed.

Specifically, it is useful that the first resin is a material for use in a photoresist, for example, a novolak resin and that the second resin is a non-novolak resin, especially a polyimide resin, an epoxy resin, a phenol resin other than the novolak resin, or a silicone resin. Here, the "novolak resin" is a phenol resin formed from oligomer obtained by condensation of phenol or a derivative thereof under an acidic catalyst.

When such a material is used, the shape control property of the first resin is securely improved as compared with the second resin, and the insulation property and the resistance to the environment of the second resin are securely improved as compared with the first resin.

Alternatively, it is preferable that the first resin is a positive tone (type) photosensitive material and that the second resin is a negative tone (type) photosensitive material.

In this case, an exposed portion of the positive tone photosensitive material is removed by development, so that a portion of the material of the first resin in the first opening is exposed. At this time, exposure is intensified at an upper portion of the photosensitive material, so that the first opening formed into a tapered shape by the development easily has a so-called mortar-like tapered shape (a hen narrowed shape, an inverted trapezoidal shape). Conversely, the hem angle (a taper angle) of the first resin in the first opening is reduced, and the whole wall easily becomes a gently inclined wall. During the subsequent heat curing by post-baking, an opening end shrinks more largely than a bottom portion, and hence the hem angle of the first resin in the first opening is further easily reduced.

On the other hand, an exposed portion of the negative tone photosensitive material remains during the development, and hence a portion of the material of the second resin at the second opening is masked. At this time, the exposure is similarly intensified at the upper portion of the photosensitive material, so that the second opening formed into an inverted tapered shape by the development easily has a so-called inverted mortar-like shape (a hem enlarged shape, a trapezoidal shape). Conversely, the hem angle of the second resin in the second opening becomes an inverted tapered angle, and inclination with respect to a bottom portion easily becomes steep. Then, during the subsequent heat curing by the post-baking, an opening end shrinks more largely than a bottom portion, and hence the hem angle of the second resin in the second opening is reduced as compared with an initial stage, but is larger than that of the first resin in the first opening, and a wall surface easily has a steep inclination.

Therefore, the first resin is flattened (planarized) more easily than the first resin, and hence the thickness of the second resin is easily set to be larger than that of the first resin, so that the $V_{BD}$ between the first conductor and the second conductor can further be increased as described above. The concentration of the electric field on the peripheral edge of the bottom wall of the first opening can be suppressed, and the dielectric breakdown due to the concentration can securely be prevented.

Moreover, a manufacturing method of a thin film capacitor according to the present invention is a method for effectively manufacturing the thin film capacitor of the present invention, and the method includes a step of forming a first conductor; a step of forming a second conductor; a step of forming a dielectric layer between the first conductor and the second conductor; and a step of forming a resin layer between the first conductor and the second conductor. The step of forming the resin layer has a step of providing, between the first conductor and the second conductor, a first resin having a first opening in a region where the first conductor or the second conductor and the dielectric layer are superimposed; and a step of providing, between the first conductor and the second conductor, a second resin having a second opening which is disposed above the first opening and which is opened more widely than the first opening.

According to the present invention, the resin layer provided between the first conductor and the second conductor is constituted of a plurality of layers including the first resin and the second resin, the capacitor is defined in accordance with a size of the first opening formed in the first resin, and the second opening formed in the second resin is formed to be larger than the first opening, whereby the fluctuations of the capacitor capacity can be suppressed, and the $V_{BD}$ can further be increased. As a result, it is possible to improve the device characteristics of the thin film capacitor and the reliability of the product.

DESCRIPTION OF THE PREFERRED EMBODIMENT

Figure 1:
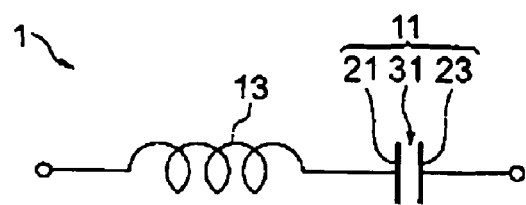
FIG. 1 is an equivalent circuit diagram showing a constitution example of an electronic component including a first embodiment of a thin film capacitor according to the present invention.
Figure 2:
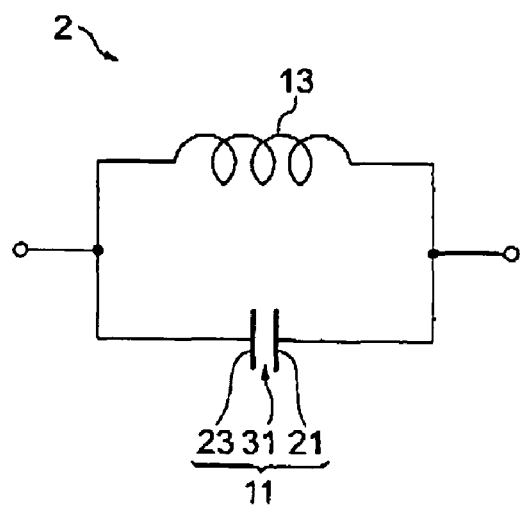
FIG. 2 is an equivalent circuit diagram showing a constitution example of the electronic component including the first embodiment of the thin film capacitor according to the present invention.
Figure 3:
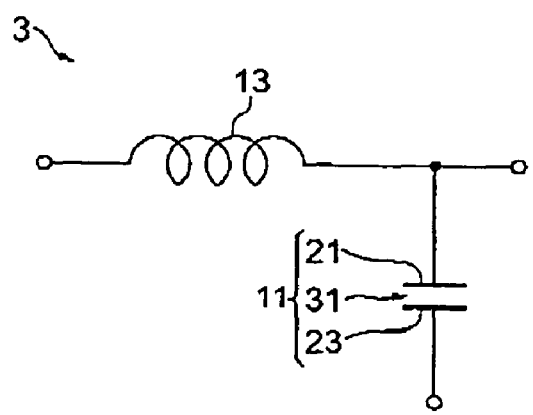
FIG. 3 is an equivalent circuit diagram showing a constitution example of the electronic component including the first embodiment of the thin film capacitor according to the present invention.
Figure 4:
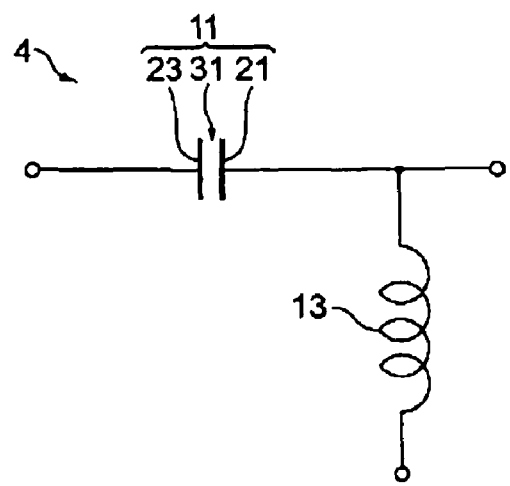
FIG. 4 is an equivalent circuit diagram showing a constitution example of the electronic component including the first embodiment of the thin film capacitor according to the present invention.

Embodiments of the present invention will hereinafter be described in detail. It is to be noted that the same elements are denoted with the same reference numerals, and redundant description is omitted. Vertical and horizontal positional relationships and the like are based on positional relationships shown in the drawings unless otherwise specified. Furthermore, a dimensional ratio of the drawing is not limited to a shown ratio. The following embodiments illustrate the present invention, and it is not intended that the present invention is limited only to the embodiments. In addition, the present invention can variously be modified without departing from the scope.

[First Embodiment of Thin Film Capacitor and Electronic Component Including the Capacitor]

FIGS. 1 to 4 are equivalent circuit diagrams showing constitution examples of an electronic component including a first embodiment of a thin film capacitor according to the present invention. An electronic component 1 shown in FIG. 1 has a capacitor 11 (a thin film capacitor) as a capacity element formed by a thin film formation technology, and an inductor 13 electrically connected to the capacitor, and the capacitor 11 is connected in series to the inductor 13 to constitute a series resonant circuit. In an electronic component 2 shown in FIG. 2, a capacitor 11 is connected in parallel to an inductor 13 to constitute a parallel resonant circuit. Furthermore, in an electronic component 3, a capacitor 11 and an inductor 13 constitute a low pass filter. In addition, in an electronic component 4 shown in FIG. 4, a capacitor 11 and an inductor 13 constitute a high pass filter.

Figure 5:
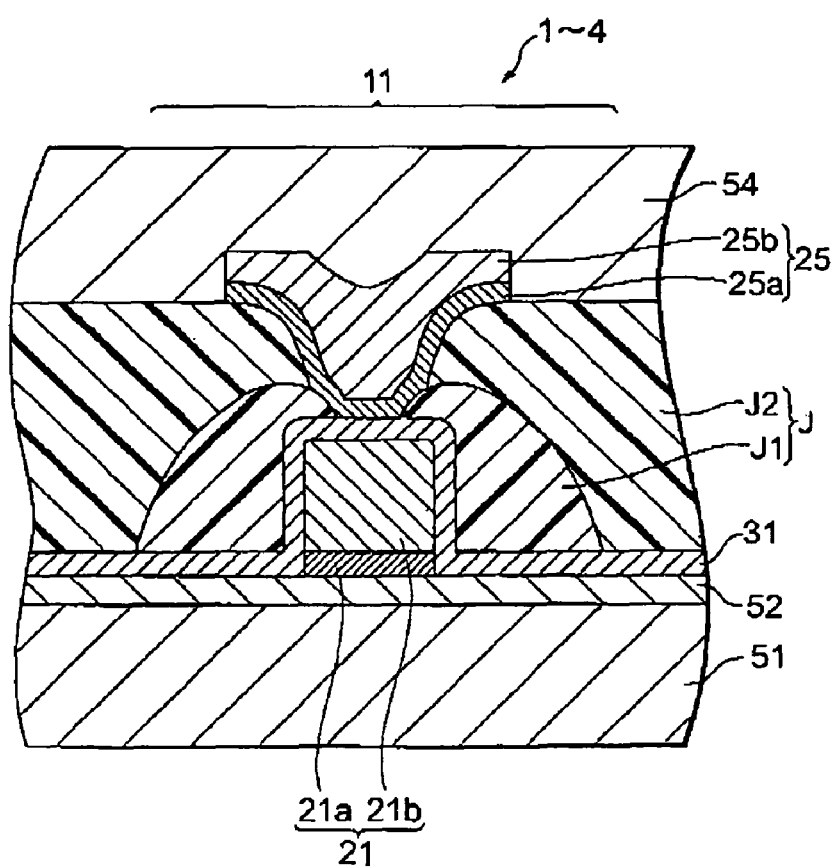
FIG. 5 is a sectional view showing a capacitor 11 and a main part around the capacitor in the electronic component.

FIG. 5 is a sectional view showing the capacitor 11 and a main part around the capacitor in the electronic components 1 to 4. In the electronic components 1 to 4, the capacitor 11 and the inductor 13 (not shown in FIG. 5) having a conductor coil are formed on a flat substrate 51 as a base material including a planarization layer 52 formed on the surface thereof. The substrate 51 and the planarization layer 52 are formed of, for example, alumina ($Al_2O_3$), and the surface of the planarization layer 52 is polished by, for example, a chemical mechanical polishing (CMP) process, and planarized.

Moreover, the capacitor 11 has a constitution in which a lower conductor 21 (a first conductor), a dielectric film 31 (a dielectric layer), a resin layer J and an upper conductor 25 (a second conductor) are successively laminated on the planarization layer 52 of the substrate 51. The lower conductor 21 is constituted of an underlayer conductor 21a formed on the planarization layer 52 and made of, for example, titanium (Ti)/copper (Cu), and a conductor 21b formed on the underlayer conductor 21a and made of copper (Cu). The lower conductor 21 is formed of a low-resistance conductive material such as Cu in this manner, whereby an equivalent series resistance (ESR) of the capacitor 11 can be reduced.

The lower conductor 21 has an electrode portion which faces the upper conductor 25 via the dielectric film 31 and which functions as an electrode of the capacitor 11, and a drawn conductor portion drawn so as to connect this electrode portion to a coil conductor (not shown) of the inductor 13, or another internal or external terminal or electrode (not shown). The electrode portion occupies a flat circular or square region substantially in the center of the lower conductor 21. The drawn conductor portion in the lower conductor 21 extends in such an arbitrary shape as to connect the electrode portion to a connection target. This drawn conductor portion is formed to be broad and as short as possible, whereby the ESR and an equivalent series inductance (ESL) of the capacitor 11 can be reduced.

Moreover, the dielectric film 31 is formed on substantially the whole surface of the substrate 51 except a via-opening H described later, and provided so as to cover substantially the whole side and upper surfaces of the lower conductor 21 constituting the capacitor 11 and the coil conductor of the inductor 13.

Here, there is not any special restriction on a film thickness of the dielectric film 31, but the film is set to a uniform thickness of the order of, for example, 0.01 to 1 (μm), and formed to be thinner than the lower conductor 21. As a material of the dielectric film 31, for example, alumina, silicon nitride ($Si_4N_3$), silicon dioxide ($SiO_2$), tantalum oxide ($Ta_2O_5$), aluminum nitride (AlN), magnesium oxide (MgO) or the like may appropriately be used.

Furthermore, the resin layer J is constituted or a resin layer J1 (a first resin) provided on the dielectric film 31 so as to cover a periphery of the lower conductor 21, and a resin layer J2 provided so as to cover substantially the whole resin layer J1.

Figure 6:
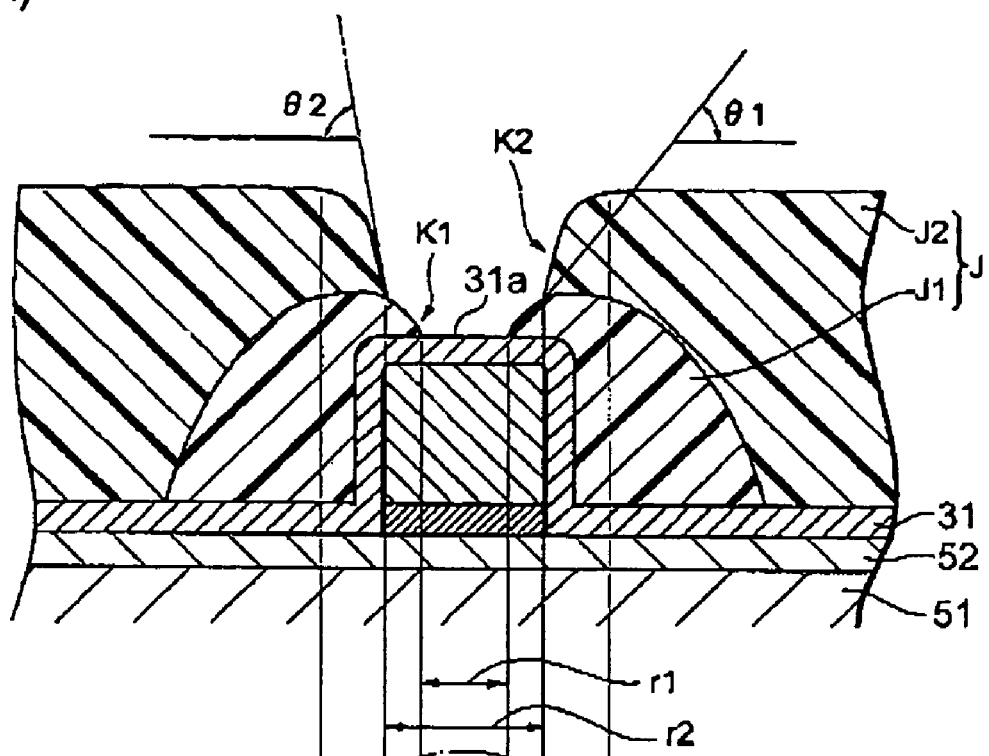
FIGS. 6A and 6B are a sectional view and a top plan view showing a main part under an upper conductor in the capacitor 11.
Figure 6:
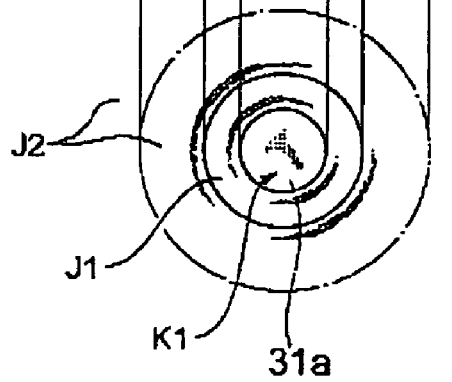

Here, FIGS. 6A and 6B are a sectional view and a top plan view showing a main part under the upper conductor 25. The resin layer J1 has an opening K1 (a first opening) in a region where the lower conductor 21, the upper conductor 25 and the dielectric film 31 are superimposed, and the resin layer J2 formed on the resin layer J1 has an opening K2 released (opened) above the opening K1 of the resin layer J1. In consequence, a part (the center) of an upper surface 31a of the dielectric film 31 is exposed in the openings K1, K2. In FIG. 6B, the openings K1, K2 having a flat circular shape are illustrated. As shown in the drawing, a minimum opening diameter r2 of the opening K2 of the resin layer J2 is larger than a minimum opening diameter r1 of the opening K1 of the resin layer J1, that is, the opening K2 is opened more widely than the opening K1.

Moreover, a hem angle θ1 of the resin layer J1 in the opening K1 (a shown inner angle formed by a wall surface of the resin layer J1 with respect to an extended plane direction of the upper surface 31a in a portion where an inner wall of the opening K1 of the resin layer J1 comes in contact with the upper surface 31a of the dielectric film 31) is set to be smaller than a hem angle θ2 of the resin layer J2 in the opening K2 (a shown inner angle formed by a wall surface of the resin layer J2 with respect to an extended direction of the upper surface 31a in a portion where an inner wall of the opening K2 of the resin layer J2 comes in contact with the upper surface of the resin layer J1). In other words, a rising angle (i.e., the hem angle θ2) of the inner wall of the resin layer J2 in the opening K2 is formed to be larger than a rising angle (i.e., the hem angle θ1) of the inner wall of the resin layer J1 in the opening K1. Furthermore, a maximum thickness of the resin layer J2 is set to be larger than that of the resin layer J1.

Furthermore, a positive tone photosensitive material (a positive tone photoresist) is preferable as a material of the resin layer J1, and more preferable examples of the material include a material mainly composed of a novolak resin. On the other hand, the resin layer J2 is made of a material different from that of the resin layer J1, for example, a material mainly composed of a non-novolak resin, preferably a negative tone photosensitive material (a negative tone photoresist), more specific examples of the material include a polyimide resin (photosensitive polyimide), an epoxy resin (photosensitive epoxy), a phenol resin other than the novolak resin, and a silicone resin, and the material may include an inorganic material such as alumina or ferrite.

In other words, as the material of the resin layer J1, it is preferable that a resolution of patterning of the material in photolithography (a pattern resolution) is smaller than that of the material of the resin layer J2 (a higher resolution), and it is also preferable that thermal shrinkage of the material in a heating temperature range applicable in a post-step such as post-baking is smaller than the thermal shrinkage of the second resin. On the other hand, as the material of the resin layer J2, it is preferable that a resistance value (an insulation resistance value) of the material is larger than that of the resin layer J1, and it is also preferable that hygroscopicity of the material is smaller than that of the resin layer J1.

Here, turning back to FIG. 5, the upper conductor 25 is constituted of an underlayer conductor 25a made of, for example, Ti/Cu and provided so as to cover the above-mentioned opening K1 of the resin layer J1 and the opening K2 of the resin layer J2, and a conductor 25b made of, for example, Cu and formed on the underlayer conductor 25a. The upper conductor 25 is formed of a low-resistance conductive material such as Cu in this manner, whereby the ESR of the capacitor 11 can further be reduced.

This upper conductor 25 has an electrode portion which faces the lower conductor 21 via the dielectric film 31 and which functions as an electrode of the capacitor 11, that is, a columnar portion (i.e., a portion which occupies a flat circular or square region of substantially the center of the upper conductor 25) which abuts on the exposed portion of the upper surface 31a of the dielectric film 31 in the opening K1, and a drawn conductor portion drawn so as to connect this electrode portion to an inner or outer terminal or electrode (not shown). Thus, in the above-mentioned electrode portion of the lower conductor 21, the electrode portion of the upper conductor 25 and the dielectric film 31 nipped between the portions, mainly the exposed portion in the opening K1 constitutes the capacitor 11, an area of the electrode portion of the upper conductor 25 is determined by the opening K1 of the resin layer J1 (depends on an area of the opening K1), and a capacity value of the capacitor 11 is defined by the area of the electrode portion of the upper conductor 25, and a film thickness and permittivity of the dielectric film 31 nipped between the upper conductor 25 and the lower conductor 21.

Moreover, the drawn conductor portion of the upper conductor 25 extends in such an arbitrary shape as to connect the electrode portion to a connection target, and this drawn conductor portion is formed to be broad and as short as possible in the same manner as in the lower conductor 21, whereby the ESR and the ESL of the capacitor 11 can further be reduced. Furthermore, a thickness of the upper conductor 25 is formed to be sufficiently as large as that of the lower conductor 21. In consequence, a Q characteristic of the capacitor 11, and a high-frequency characteristic such as a self resonance frequency (SRF) thereof can be improved, and a transmission loss can be suppressed.

Furthermore, a protective film 54 made of, for example, alumina or the like is formed on the whole surfaces of the upper conductor 25 and the resin layer J.

A procedure for manufacturing the electronic components 1 to 4 having such a constitution will be described mainly in accordance with the capacitor 11 and a region around the capacitor. FIGS. 7 to 15 are step diagrams (sectional views) showing a state in which the electronic components 1 to 4 including the capacitor 11 are manufactured. It is to be noted that with regard to the electronic components 1 to 4, a large number of electronic components are simultaneously formed on the substrate 51. However, FIGS. 7 to 15 mainly show a region where the capacitor 11 is formed in a region where elements of one electronic component are formed.

Figure 7:
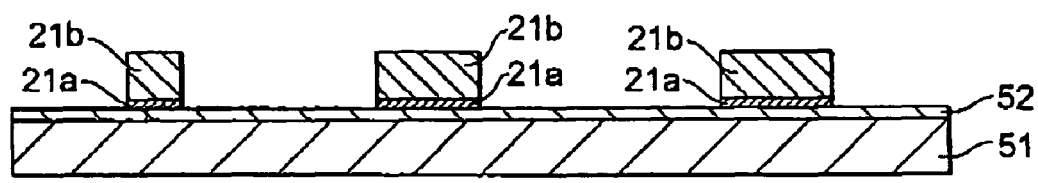
FIG. 7 is a step diagram showing a state in which the electronic component including the capacitor 11 is manufactured.

First, the surface of the substrate 51 made of alumina is polished by a CMP process to form the planarization layer 52. Subsequently, titanium (Ti) having a film thickness of, for example, about 10 to 50 (nm) and copper (Cu) having a film thickness of, for example, about 0.1 to 0.5 ($\mu$m) are successively laminated on the planarization layer 52 of the substrate 51 by, for example, a sputtering process, thereby forming an underlayer conductor. A photosensitive material (a photoresist) is patterned further on the underlayer conductor by photolithography, Cu having a thickness of, for example, about 10 ($\mu$m) is formed into a film on the underlayer conductor in the opening by, for example, an electrolytic plating process, and then the surface of the conductor is polished as much as a desired thickness by a CMP process to form the conductors 21b. Subsequently, the photosensitive material is peeled, and then the underlayer conductors exposed between the conductors 21b are removed by dry or wet etching or the like, whereby the lower conductors 21 constituted of the underlayer conductors 21a and the conductors 21b are formed (FIG. 7). Thus, the lower conductors 21 can be formed by, for example, a semi-additive (a precipitation process) process. It is to be noted that the coil conductor of the inductor 13 (not shown) can be formed simultaneously with the formation of the lower conductors 21 by desired patterning.

Figure 8:
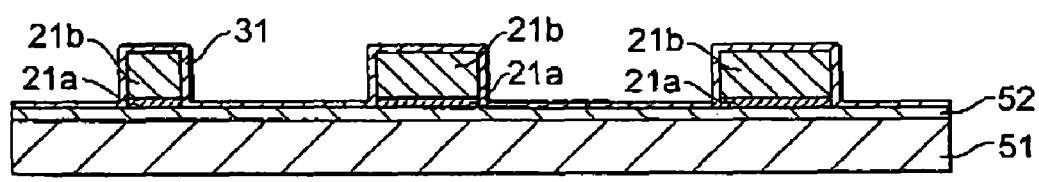
FIG. 8 is a step diagram showing a state in which the electronic component including the capacitor 11 is manufactured.
Figure 9:
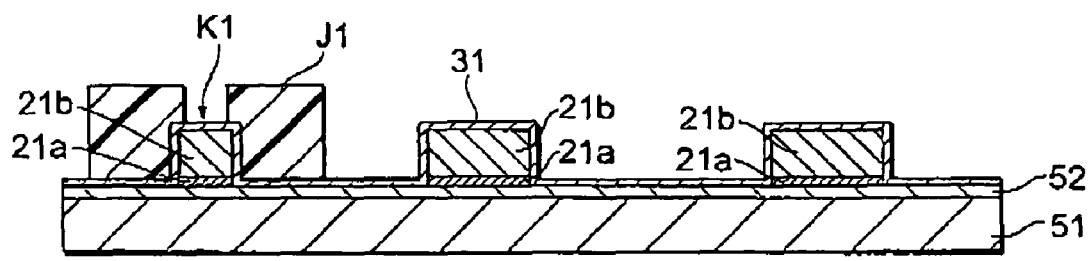
FIG. 9 is a step diagram showing a state in which the electronic component including the capacitor 11 is manufactured.

Subsequently, the dielectric film 31 having a thickness of, for example, about 0.01 to 1 ($\mu$m) is formed on the whole surface of the substrate 51 provided with the lower conductors 21 (FIG. 8). Subsequently, the whole surface of the dielectric film 31 is coated with, for example, the positive tone photosensitive material mainly composed of the novolak resin to obtain a film thickness of, for example, about 0.5 to 5 ($\mu$m), and then the film of the photosensitive material is pre-baked. Afterward, the film is exposed and developed to remove portions other than the portions of the resin layer J1 (FIG. 9). Subsequently, the film is post-backed to form the resin layer J1 (FIG. 10).

Figure 10:
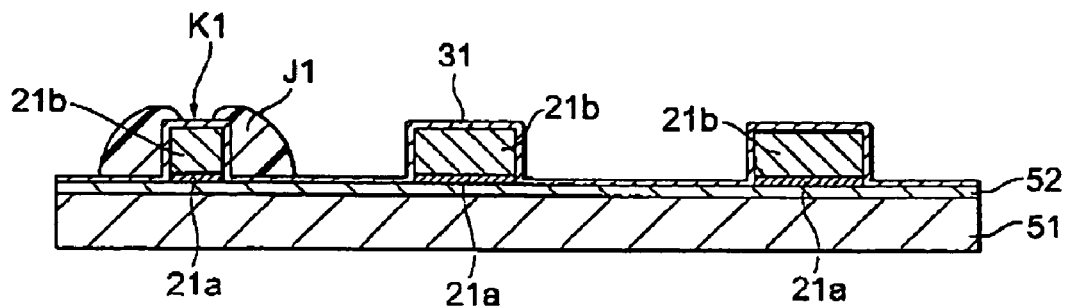
FIG. 10 is a step diagram showing a state in which the electronic component including the capacitor 11 is manufactured.

The resin layer J1 is cured and contracted by the post-baking to obtain a maximum film thickness of about 0.5 to 5 ($\mu$m), and a shape close to a rectangular sectional shape as shown in FIG. 9 is formed into a gentle mountain-like sectional shape as shown in FIG. 10. It is to be noted that the exposed portion of the positive tone photosensitive material is removed by the development, and the exposure is intensified at an upper portion of the photosensitive material, so that the opening K1 in the portion forming the resin layer J1 by the development as shown in FIG. 9 is easily formed into a so-called mortar-like shape (a hem narrowed shape, an inverted trapezoidal shape). That is, the portion forming the resin layer J1 is originally easily formed into a hem-widened planarized mountain-like shape, the resin layer J1 thermally contracted by the post-baking has a further smooth mountain-like shape, and the hem angle $\theta 1$ of the inner wall in the opening K1 is reduced (see FIG. 6).

Figure 11:
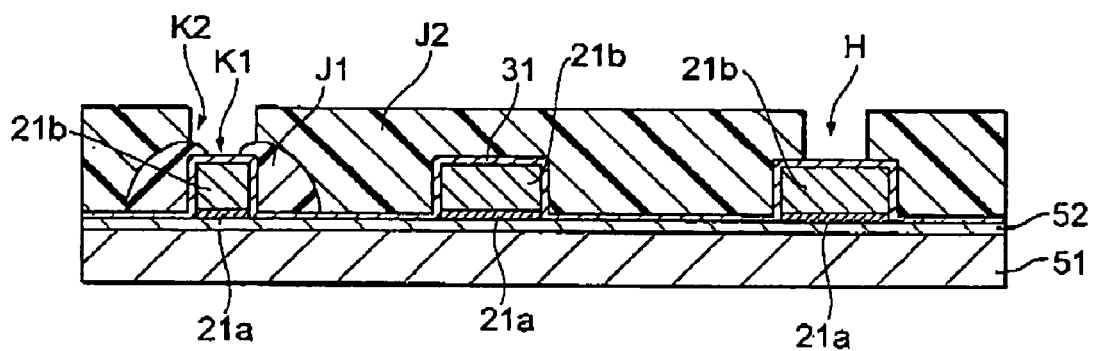
FIG. 11 is a step diagram showing a state in which the electronic component including the capacitor 11 is manufactured.

Next, the whole surface of the substrate 51 provided with the resin layer J1 as shown in FIG. 10 is coated with, for example, the negative tone photosensitive material mainly composed of the polyimide resin so as to obtain a film thickness of, for example, about 5 to 10 ($\mu$m), and then the film of the photosensitive material is pre-baked. Subsequently, the film is exposed and developed to remove portions forming the opening K2 of the resin layer J2 and the via-opening H for a contact (FIG. 11). Subsequently, the film is post-baked to form the resin layer J2 (FIG. 12).

Figure 12:
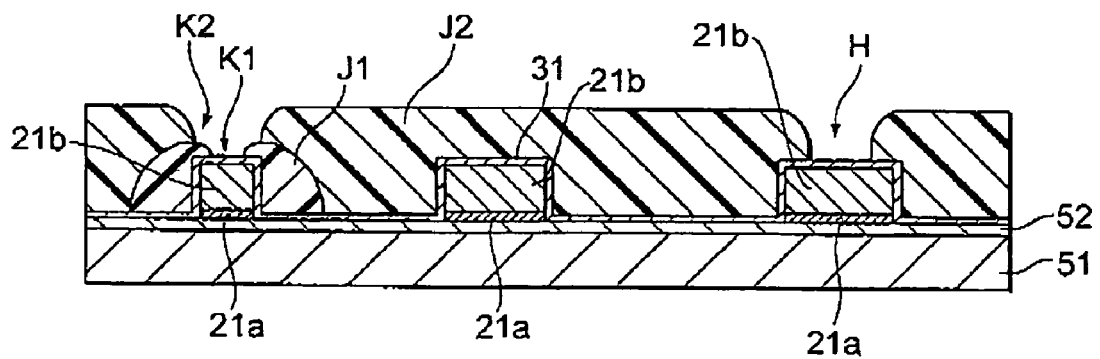
FIG. 12 is a step diagram showing a state in which the electronic component including the capacitor 11 is manufactured.

The resin layer J2 is cured and contracted by the post-baking to obtain a maximum film thickness of about 3 to 8 ($\mu$m), and a shape close to a rectangular sectional shape as shown in FIG. 11 is formed into a sectional shape shown in FIG. 12. It is to be noted that the exposed portion of the negative tone photosensitive material remains by the development, and the exposure is intensified at an upper portion of the photosensitive material, so that the opening K2 in the portion forming the resin layer J2 by the development as shown in FIG. 11 is easily formed into an inverted mortar-like shape close to a substantially rectangular shape (a hem widened shape, a trapezoidal shape). Therefore, in the resin layer J2 thermally contracted by the post-baking, unlike the resin layer J1, the inner wall of the opening K2 is not easily formed into a gently inclined shape, and the hem angle $\theta 2$ of the inner wall is set to be steeper than the hem angle $\theta 1$ (see FIG. 6A).

Figure 13:
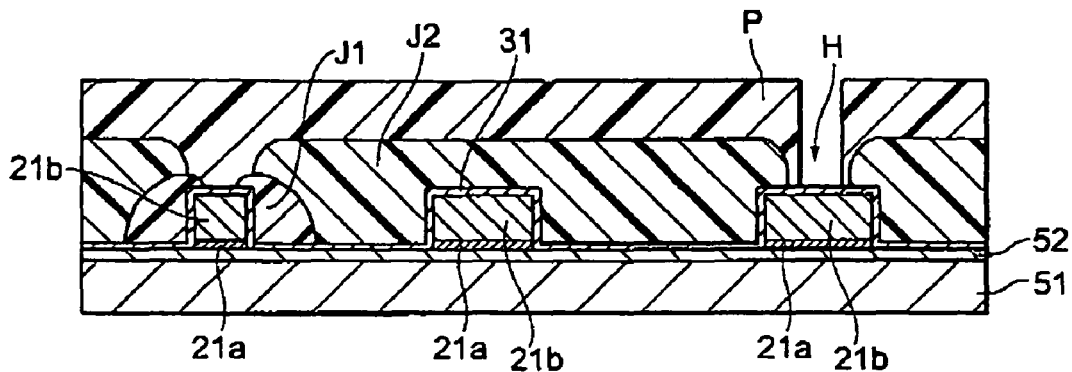
FIG. 13 is a step diagram showing a state in which the electronic component including the capacitor 11 is manufactured.
Figure 14:
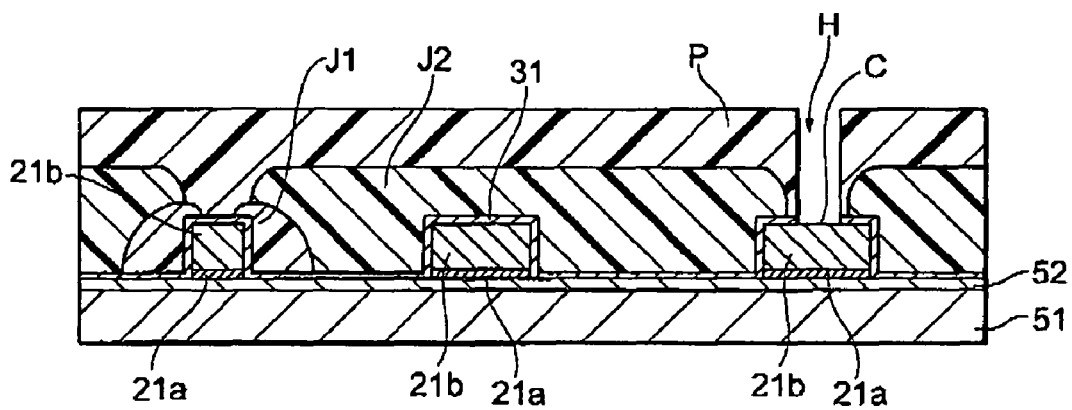
FIG. 14 is a step diagram showing a state in which the electronic component including the capacitor 11 is manufactured.
Figure 15:
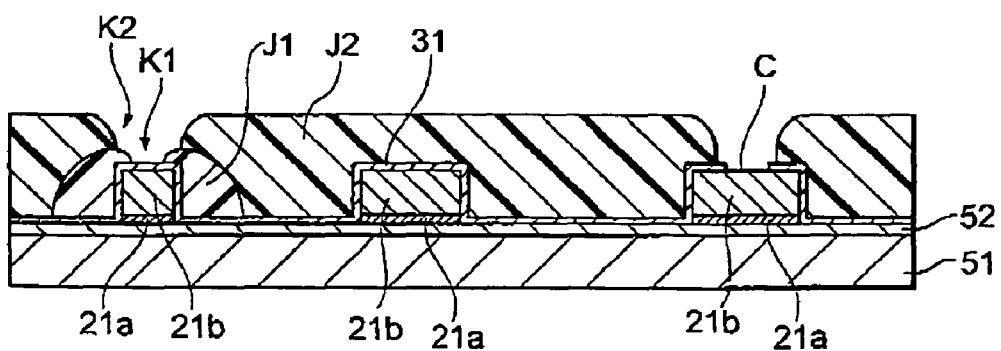
FIG. 15 is a step diagram showing a state in which the electronic component including the capacitor 11 is manufactured.

Subsequently, the photosensitive material (the photoresist) is patterned by photolithography on the substrate 51 provided with the resin layer J2 as shown in FIG. 12, to open the portion of the via-opening H (FIG. 13). Subsequently, milling is performed using a remaining photosensitive material layer P as a mask, and the dielectric film 31 exposed in the via-opening H is removed to expose the lower conductor 21 disposed under the dielectric film (FIG. 14). It is to be noted that an exposed portion C of this lower conductor 21 is connected to, for example, the inductor 13, and can be a portion which comes in contact with the upper conductor 25 formed later. Then, the photosensitive material layer P is removed (FIG. 15), and then the upper conductor 25 constituted of the underlayer conductor 25a and the conductor 25b is formed on the exposed portion in the same manner as in the above-mentioned lower conductor 21 as shown in FIG. 5 (subsequently, not shown), to obtain the capacitor 11. Then, as shown in FIG. 5, the protective film 54 made of alumina and having a thickness of about 10 to 20 ($\mu$m) is formed on the whole surface.

Then, the substrate 51 is cut along a predetermined cutting line, and a plurality of electronic components 1 to 4 formed on the substrate 51 are separated into chips for each element forming region. Furthermore, although not shown, outer electrodes to be electrically connected to the lower conductor 21 and/or the upper conductor 25 exposed to a cut surface are formed on the cut surface, and, if necessary, a processing treatment such as chamfering of corner portions is performed before or after the outer electrodes are formed, to obtain the electronic components 1 to 4.

According to the capacitor 11 having such a constitution according to the present invention and the electronic components 1 to 4 including the capacitor, a resin having an excellent shape control property, for example, the novolak resin or the like is used as the resin layer J1 of the resin layer J which defines the capacitor 11 with the opening K1, so that shape uniformity and stability of the opening K1, that is, shape precision of the opening K1 can be improved. In consequence, characteristic fluctuations of the capacitor 11 between products and between product batches can sufficiently be suppressed. In other words, an electrode area of the capacitor 11 can precisely be formed. Moreover, for example, the polyimide resin having excellent insulation property and resistance to environment as compared with the resin layer J1 is used on the resin layer J1, so that a $V_{BD}$ between the lower conductor 21 and the upper conductor 25 can be increased, the insulation property therebetween can be improved, and deterioration of the $V_{BD}$ with time can be suppressed. Therefore, it is possible to improve device characteristics of the capacitor 11 and the electronic components 1 to 4 including the capacitor and reliability of the product.

Moreover, the thickness of the resin layer J2 is larger than that of the resin layer J1, so that the $V_{BD}$ between the lower conductor 21 and the upper conductor 25 can further be increased, the insulation property therebetween can further be improved, and the deterioration of the $V_{BD}$ with time can further be suppressed. Furthermore, the hem angle $\theta 2$ of the resin layer J2 in the opening K2 is set to be larger than the hem angle $\theta 1$ of the resin layer J1 in the opening K1, so that the resin layer J1 can be planarized more easily than the resin layer J2. In consequence, the thickness of the resin layer J2 having the excellent insulation property can easily be set to be larger than that of the resin layer J1. Therefore, as described above, the $V_{BD}$ between the lower conductor 21 and the upper conductor 25 can further be increased, and the insulation property therebetween can further be improved.

Furthermore, in the opening K1 in which the capacitor 11 is defined, the hem angle $\theta 1$ of the resin layer J1 can be reduced, and the rising angle of the wall surface can be reduced, so that it can effectively prevented that an inner wall surface of the resin layer J1 has an acute angle with respect to a bottom surface thereof (the exposed upper surface 31a of the dielectric film 31), and vertically extends, for example, at an angle close to perpendicularity and that an electric field is accordingly concentrated on a peripheral edge of a bottom wall of the opening K1. In consequence, generation of dielectric breakdown in the corresponding portion can be suppressed. In addition, the resin layer J1 is formed of the positive tone photosensitive material, and the resin layer J2 is formed of the negative tone photosensitive material, so that the hem angle $\theta 1$ of the resin layer J1 in the opening K1 can be set to a further moderate tilt angle. Therefore, it can further effectively be prevented that the electric field is concentrated on the peripheral edge of the bottom wall of the opening K1.

In addition, the resin layer J2 having the excellent insulation property covers substantially the whole resin layer J1, the region where the resin layer J2 is formed is set to be larger than the region where the resin layer J1 is formed, and a volume of the resin layer J2 is larger than that of the resin layer J1, so that the insulation property between the lower conductor 21 and the upper conductor 25 can further be improved. Furthermore, the thickness of the resin layer J2 in such a resin layer J can sufficiently be secured, so that parasitic capacities of the lower conductor 21 and the upper conductor 25 in the vicinity of peripheral edges of the openings K1, K2 can be reduced. Even in the portion of the inductor 13 provided together with the capacitor 11, floating capacities of the coil conductor and between the conductors can be reduced. Therefore, it is possible to obtain useful effects that self resonance frequencies and antiresonant frequencies of the electronic components 1 to 4 are increased, the Q characteristic is further improved, insertion losses in filter circuits constituted of LC resonant circuits such as the electronic components 1 to 4 are reduced, suppression of a decay amount of an out-of-band characteristic is improved and steepness of a blocking region is reduced.

In addition, the dielectric film 31 covers an upper surface and a side surface of the lower conductor 21, so that the dielectric film 31 functions as a protective film for the resin layer J1 as an organic film, and generation of electromigration caused by the use of such an organic film can be prevented. Therefore, even in a case where the electromigration is expected to a disadvantage degree, it is unnecessary to form the protective film of Ni, Ti or the like on the lower conductor 21.

Moreover, when the openings K1, K2 are formed into a circular shape, as compared with a square shape, the shape stability and the shape precision during the forming of the smaller openings K1, K2 can advantageously easily be realized. That is, in a case where further miniaturization is performed, when the square openings are formed, it tends to be difficult to maintain the square shapes owing to dullness of resolution of Vertex portions (corner portions). On the other hand, such disadvantages are not easily generated in the circular openings K1, K2.

[Second Embodiment of Thin Film Capacitor and Electronic Component Including the Capacitor]

Figure 16:
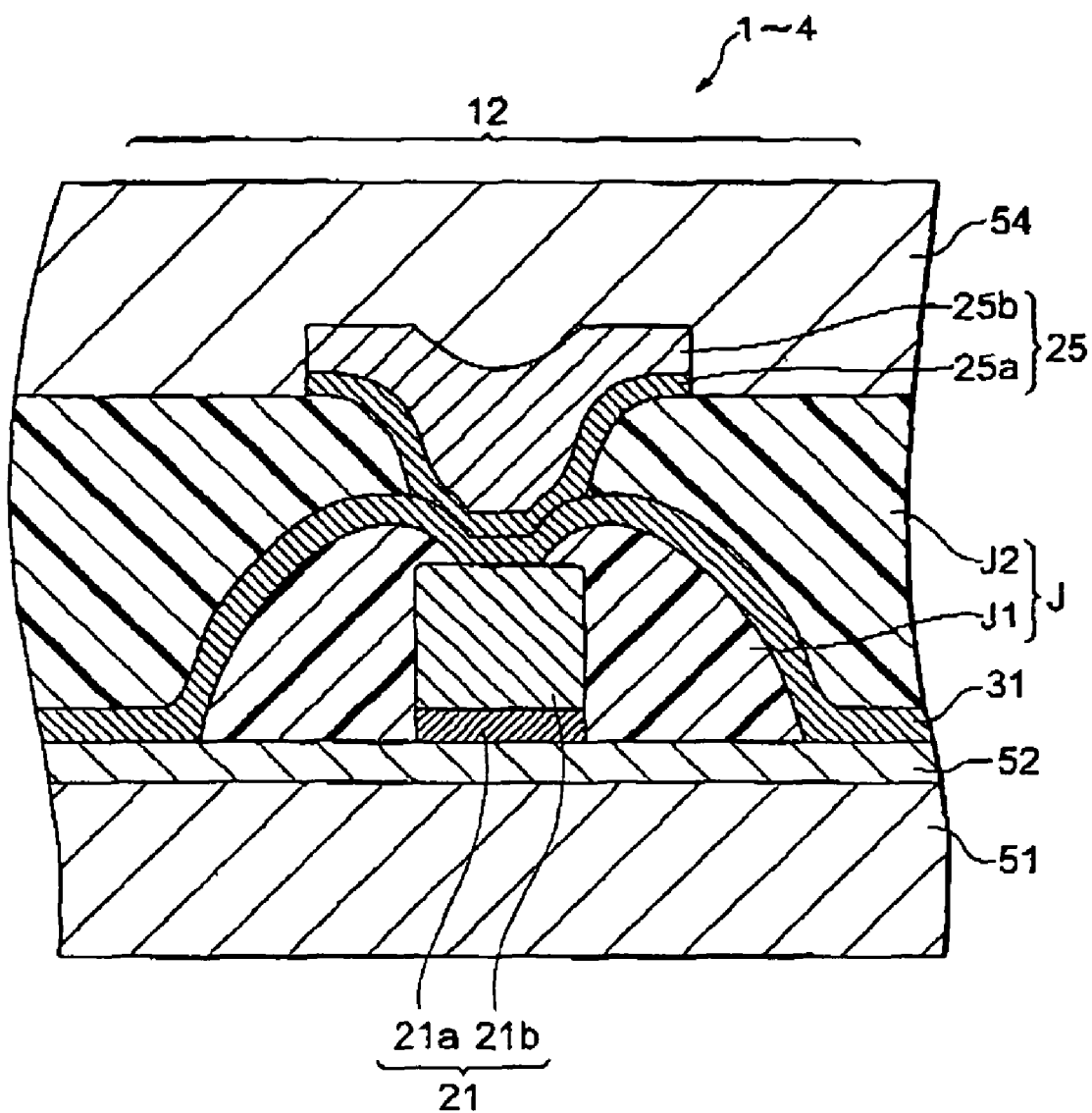
FIG. 16 is a sectional view showing a thin film capacitor and a main part around the capacitor in an electronic component including a second embodiment of the thin film capacitor according to the present invention.
Figure 17:
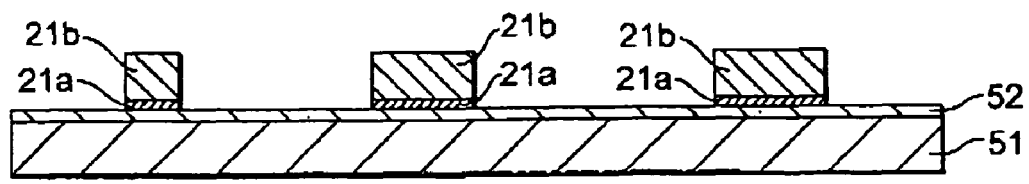
FIG. 17 is a step diagram showing a state in which the electronic component including a capacitor 12 is manufactured.
Figure 18:
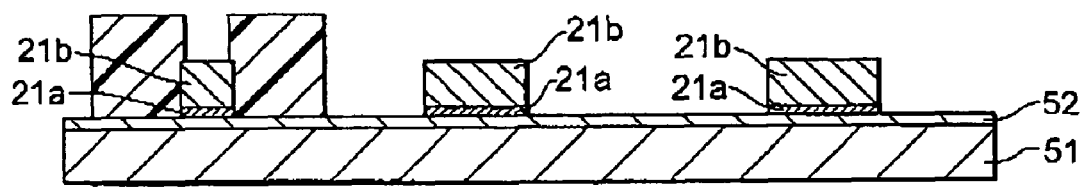
FIG. 18 is a step diagram showing a state in which the electronic component including the capacitor 12 is manufactured.
Figure 19:
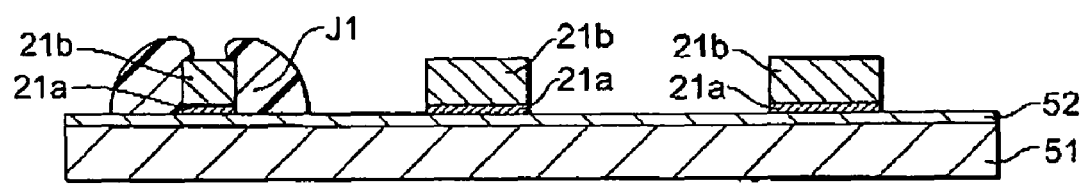
FIG. 19 is a step diagram showing a state in which the electronic component including the capacitor 12 is manufactured.
Figure 20:
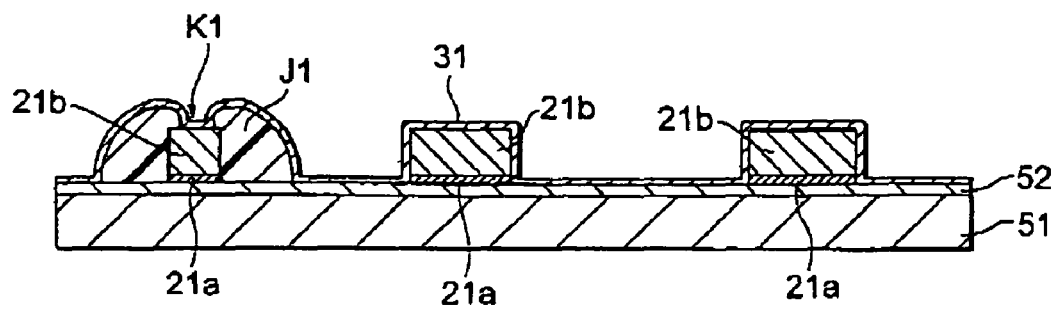
FIG. 20 is a step diagram showing a state in which the electronic component including the capacitor 12 is manufactured.
Figure 21:
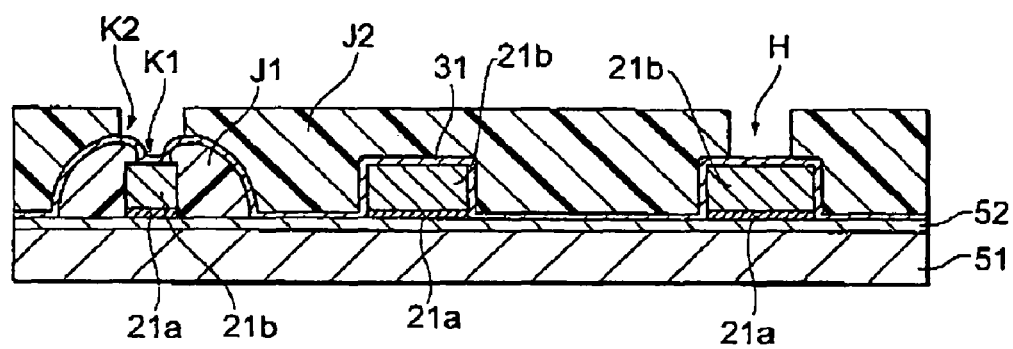
FIG. 21 is a step diagram showing a state in which the electronic component including the capacitor 12 is manufactured.
Figure 22:
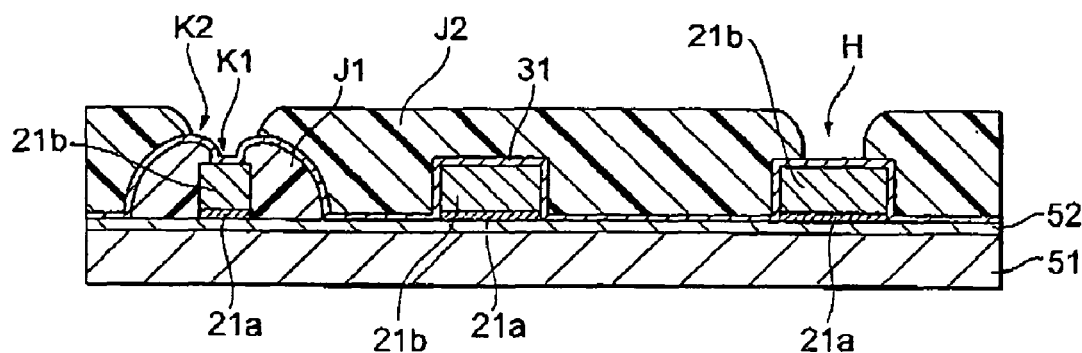
FIG. 22 is a step diagram showing a state in which the electronic component including the capacitor 12 is manufactured.
Figure 23:
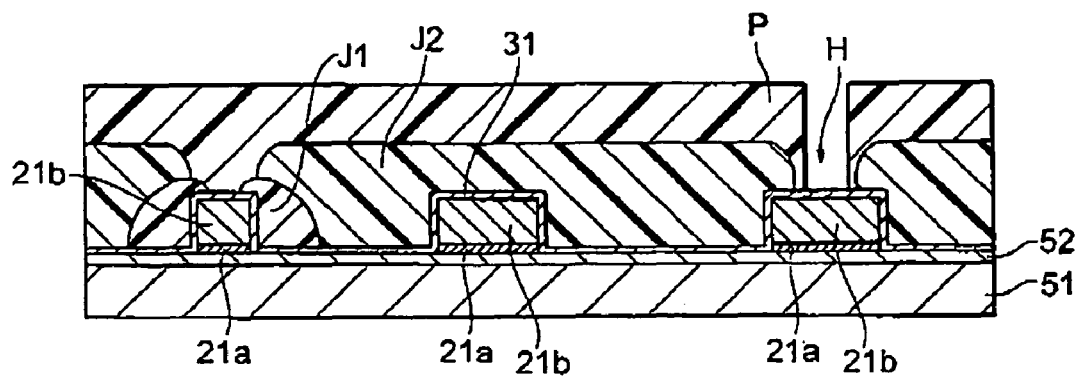
FIG. 23 is a step diagram showing a state in which the electronic component including the capacitor 12 is manufactured.
Figure 24:
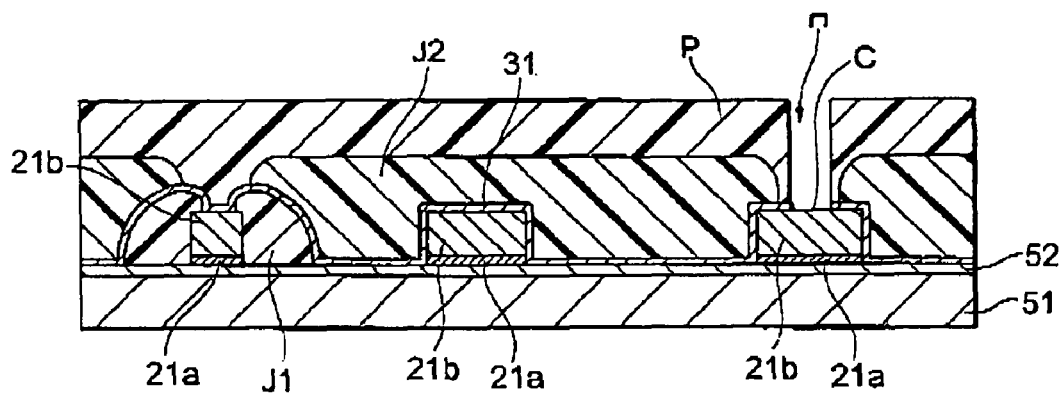
FIG. 24 is a step diagram showing a state in which the electronic component including the capacitor 12 is manufactured.
Figure 25:
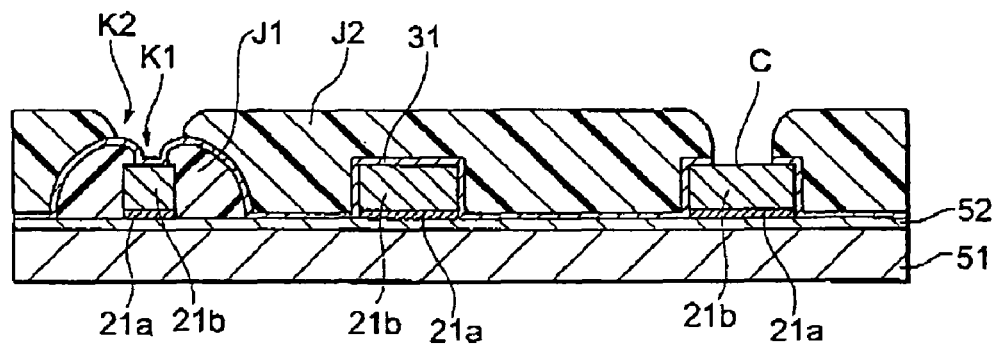
FIG. 25 is a step diagram showing a state in which the electronic component including the capacitor 12 is manufactured.

FIG. 16 is a sectional view showing a thin film capacitor and a main part around the capacitor in an electronic component (the electronic components 1 to 4) including a second embodiment of the thin film capacitor according to the present invention. The electronic component of the present embodiment is constituted in the same manner as in the electronic components 1 to 4 shown in FIGS. 1 to 6 except that the electronic component includes a capacitor 12 (a thin film capacitor) instead of the capacitor 11, and in FIG. 16, the electronic component is shown by the same reference numerals 1 to 4. The capacitor 12 has a constitution similar to that of the capacitor 11 except that a dielectric film 31 is provided between a resin layer J1 and a resin layer J2.

Here, FIGS. 17 to 25 are step diagrams showing a state in which the electronic components 1 to 4 including the capacitor 12 are manufactured, and the drawings correspond to FIGS. 7 to 15. That is, the capacitor 12 can be obtained by forming the resin layer J1 before forming the dielectric film 31 (FIGS. 17 to 19), forming the dielectric film 31 on the whole surface if the resin layer (FIG. 20), then forming the resin layer J2 (FIGS. 21 and 22), and then performing formation of a via-opening H, milling of the dielectric film 31 and formation of an upper conductor 25 and a protective film 54 in the same manner as in the electronic components 1 to 4 including the capacitor 11.

Figure 26:
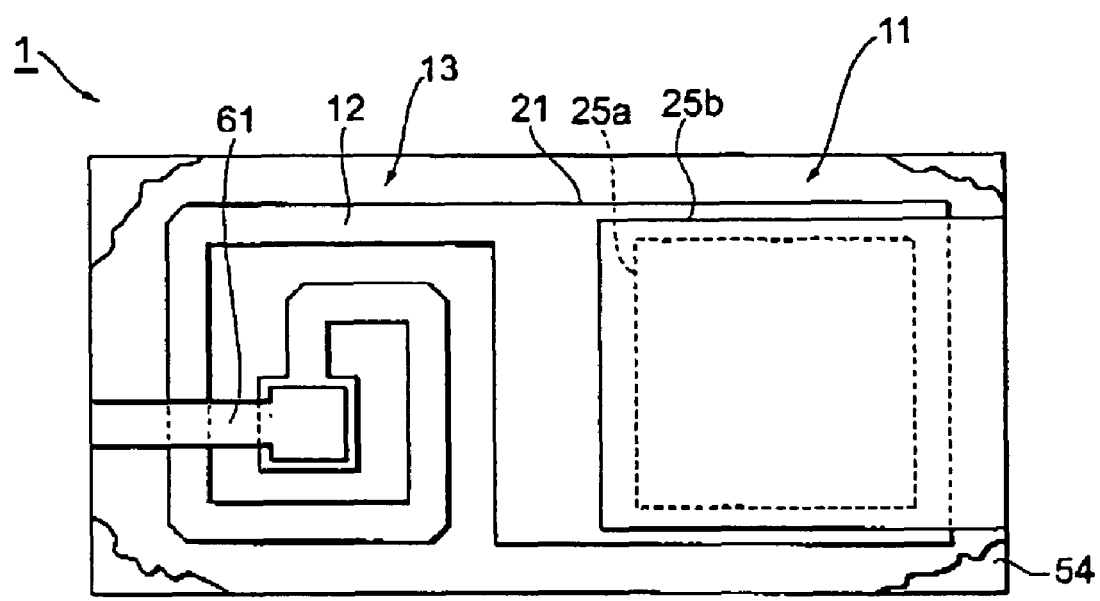
FIG. 26 is a plan view (a partially broken diagram) showing an electronic component 1 including the capacitor 11.

Furthermore, FIG. 26 is a plan view (a partially broken diagram) showing the electronic component 1 including the capacitor 11. In the electronic component 1, as described above with reference to FIG. 1, an inductor 13 is connected in series to a capacitor 11, and the component functions as a series resonant circuit. The inductor 13 includes a coil conductor 12, and a conductor 61 connected to an inner peripheral end of the coil conductor 12. The coil conductor 12 is formed similarly to and/or simultaneously with a lower conductor 21 of the capacitor 11, and connected to the lower conductor 21. The conductor 61 is formed similarly to and/or simultaneously with the upper conductor 25 of the capacitor 11.

According to the coil conductor 12 having such a constitution and the electronic components 1 to 4 including the capacitor, it is possible to produce functions and effects similar to those of the capacitor 11 and the electronic components 1 to 4 including the capacitor, shape stability and shape precision of the resin layer J1 can further be improved. That is, in a case where the resin layer J1 is bonded to the lower conductor 21 made of Cu, a bonding property improves as compared with a case where the resin layer J1 is bonded to the dielectric film 31 as in the capacitor 11. In consequence, it is possible to securely prevent a disadvantage that during a thermal treatment such as post-baking, the resin layer J1 peels, and is cracked to become brittle, and a shape of the layer easily changes owing to decrease of strength, or during development of the resin layer J1, a development solution invades an interface between the resin layer J1 and the dielectric film 31 to peel or dislocate the resin layer J1.

It is to be noted that as described above, the present invention is not limited to the above embodiments, and can variously be modified without departing from the scope. For example, the structures of the capacitors 11, 12 are applicable even to the electronic component 1 having a laminate type capacitor in which the conductors and the dielectric films 31 are repeatedly laminated in order. Specifically, the same capacitor 11 or 12 may repeatedly be laminated, or the capacitors 12 may alternately and repeatedly laminated on the capacitors 11.

Moreover, the upper conductor 25 may be used only as the drawn conductor portion, a conductive layer functioning as the second conductor may be provided under the upper conductor 25. Furthermore, opening shapes of the openings K1, K2 are not limited to a circular shape, and, for example, a square shape may be used. Furthermore, as a method for forming the lower conductor 21 and the upper conductor 25, in addition to the semi-additive process, a subtractive process (an etching process), a damascene process, a paste process, a lift-off process, an inkjet print process or a screen print process using a conductive material or the like may be used. Moreover, the lower conductor 21 and the upper conductor 25 may be made of another material or a plurality of different conductive materials to form the lower conductor 21 and the upper conductor 25 having a desired shape. In addition, instead of the resin layer J2, an insulating layer formed of an inorganic material such as alumina or ferrite may be provided.

As described above, according to a thin film capacitor of the present invention, a manufacturing method of the thin film capacitor and an electronic component including the thin film capacitor, fluctuations of a capacitor capacity can be suppressed, and the $V_{BD}$ can further be increased, whereby a device characteristic and reliability of a product can be improved. Therefore, the present invention can broadly and effectively be used in an apparatus, a unit, a system, any type of device and the like in which a thin film type electronic component is embedded, especially in a case where miniaturization and higher performance are required.

What is claimed is:

1. A thin film capacitor in which a dielectric layer and a resin layer are formed between a first conductor and a second conductor,
    wherein the resin layer has:
    a first resin provided between the first conductor and the second conductor and having a first opening in a region where the first conductor or the second conductor and the dielectric layer are superimposed; and
    a second resin provided between the first conductor and the second conductor and having a second opening which is disposed above the first opening and which is opened more widely than the first opening,
    wherein the dielectric layer is exposed in the first opening,
    wherein the second conductor is directly connected to the dielectric layer at the first opening, and
    wherein the resin layer is superimposed on at least a part of the dielectric layer.

2. The thin film capacitor according to claim 1, wherein the dielectric layer is provided between the first resin and the second resin.

3. The thin film capacitor according to claim 1, wherein the resin layer is formed so that a thickness of the second resin is larger than that of the first resin.

4. The thin film capacitor according to claim 1, wherein the resin layer is formed so that a hem angle of the second resin in the second opening is larger than that of the first resin in the first opening.

5. The thin film capacitor according to claim 1, wherein the resin layer is provided so that the second resin covers substantially the whole first resin.

6. The thin film capacitor according to claim 1, wherein the first resin of the resin layer is a novolak resin, and the second resin of the resin layer is a non-novolak resin.

7. The thin film capacitor according to claim 1, wherein the second resin of the resin layer is a polyimide resin, an epoxy resin, a phenol resin other than the novolak resin, or a silicone resin.

8. The thin film capacitor according to claim 1, wherein the first resin of the resin layer is a positive tone photosensitive material, and the second resin of the resin layer is a negative tone photosensitive material.

9. The thin film capacitor according to claim 1, wherein a pattern resolution of a material forming the first resin of the resin layer is smaller than that of a material forming the second resin of the resin layer.

10. The thin film capacitor according to claim 1, wherein the resin layer is formed so that thermal shrinkage of the first resin is smaller than that of the second resin.

11. The thin film capacitor according to claim 1, wherein the resin layer is formed so that a resistance value of the second resin is larger than that of the first resin.

12. The thin film capacitor according to claim 1, wherein the resin layer is formed so that hygroscopicity of the second resin is smaller than that of the first resin.

13. A manufacturing method of a thin film capacitor which comprises:
    a step of forming a first conductor;
    a step of forming a second conductor;
    a step of forming a dielectric layer between the first conductor and the second conductor; and
    a step of forming a resin layer between the first conductor and the second conductor,
    wherein the step of forming the resin layer has:
    a step of providing, between the first conductor and the second conductor, a first resin having a first opening in a region where the first conductor or the second conductor and the dielectric layer are superimposed; and
    a step of providing, between the first conductor and the second conductor, a second resin having a second opening which is disposed above the first opening and which is opened more widely than the first opening, wherein the dielectric layer is formed so as to be exposed in the first opening, wherein the second conductor is formed so as to be directly connected to the dielectric layer at the first opening, and wherein the resin layer is formed so as to be superimposed on at least a part of the dielectric layer.

14. An electronic component comprising a thin film capacitor in which a dielectric layer and a resin layer are formed between a first conductor and a second conductor, wherein the resin layer having a first resin provided between the first conductor and the second conductor and having a first opening in a region where the first conductor or the second conductor and the dielectric layer are superimposed, and a second resin provided between the first conductor and the second conductor and having a second opening which is disposed above the first opening and which is opened more widely than the first opening, wherein the dielectric layer is exposed in the first opening, wherein the second conductor is directly connected to the dielectric layer at the first opening, and wherein the resin layer is superimposed on at least a part of the dielectric layer.

* * * * *